US012604697B2

(12) United States Patent
Kim et al.

(10) Patent No.: US 12,604,697 B2
(45) Date of Patent: Apr. 14, 2026

(54) WASTE GAS TREATMENT APPARATUS FOR SEMICONDUCTOR AND DISPLAY PROCESSES

(71) Applicant: MAT Plus Co., Ltd., Anseong-si (KR)

(72) Inventors: Chul Hwan Kim, Pyeongtaek-si (KR); Dong Soo Kim, Anseong-si (KR); Hyun Kyung Kim, Pyeongtaek-si (KR); Kang Sik Shin, Pyeongtaek-si (KR); Yeo Jin Kim, Anseong-si (KR)

( * ) Notice: Subject to any disclaimer, the term of this patent is extended or adjusted under 35 U.S.C. 154(b) by 509 days.

(21) Appl. No.: 18/118,145

(22) Filed: Mar. 7, 2023

(65) Prior Publication Data

US 2024/0213047 A1 Jun. 27, 2024

(51) Int. Cl.
*H01L 21/67* (2006.01)

(52) U.S. Cl.
CPC .. *H01L 21/67051* (2013.01); *H01L 21/67098* (2013.01); *H01L 21/67248* (2013.01)

(58) Field of Classification Search
None
See application file for complete search history.

(56) References Cited

U.S. PATENT DOCUMENTS

| | | | | |
|---|---|---|---|---|
| 4,986,838 A | * | 1/1991 | Johnsgard | B01D 47/06 |
| | | | | 96/368 |
| 6,022,489 A | * | 2/2000 | Izumikawa | B01D 53/70 |
| | | | | 588/900 |
| 2006/0239869 A1 | * | 10/2006 | Irie | B01J 8/0221 |
| | | | | 422/600 |

* cited by examiner

*Primary Examiner* — Jelitza M Perez
(74) *Attorney, Agent, or Firm* — ANTONIO HA & U.S. PATENT, LLC

(57) ABSTRACT

Disclosed is a waste gas treatment apparatus for semiconductor and display processes, the apparatus including: a pre-treatment unit having an inlet and an outlet formed therein, and configured to spray a cleaning solution to waste gas introduced through the inlet to primarily treat in the waste gas; a reaction unit configured to simultaneously treat fluorine compounds and nitrous oxide ($N_2O$) in waste gas discharged from the pre-treatment unit; a post-treatment unit configured to spray a cleaning solution to waste gas discharged from the reaction unit to secondarily treat in the waste gas; and a heat exchange unit installed between the pre-treatment unit and the reaction unit.

4 Claims, 1 Drawing Sheet

100 (110, 120, 130, 140)
200 (210, 220, 230)
400 (410, 420)

100 (110, 120, 130, 140)
200 (210, 220, 230)
400 (410, 420)

→ WASTE GAS FLOW DIRECTION

WASTE GAS TREATMENT APPARATUS FOR SEMICONDUCTOR AND DISPLAY PROCESSES

CROSS-REFERENCE TO RELATED APPLICATION

This application claims priority to Korean Patent Application No. 10-2022-0184193 filed in the Korean Intellectual Property Office on Dec. 26, 2022, the disclosure of which is incorporated by reference herein in its entirety.

TECHNICAL FIELD

The present disclosure relates to an apparatus for treatment of waste gas generated in a semiconductor manufacturing process, and more particularly, a waste gas treatment apparatus for semiconductor and display processes, the apparatus capable of improving waste gas treatment efficiency and waste heat recovery rate.

DISCUSSION OF RELATED ART

In general, perfluorinated compounds such as $CF_4$, $CHF_3$, $NF_3$, and $SF_6$ are widely used as etching agents in a semiconductor etching process and as reactor cleaners in a chemical vapor deposition process.

However, since the perfluorinated compounds are not entirely consumed during the processes, unreacted gas may remain in semiconductor waste gas and consequently secondary gas may be generated. In addition, even feed gas may be discharged intact from a vacuum pump.

A perfluorinated compound is safer and more stable than conventionally used chloro-fluorocarbon (CFC), and is used instead of the CFC. However, the global warming potential of the perfluorinated compound is thousands to tens of thousands of times higher than that of carbon dioxide, thereby causing serious environmental pollution.

Thus, the emission of perfluorinated compounds into the atmosphere is strictly regulated for environmental protection, and it is expected to be more strictly regulated due to the increasing interest in environmental pollution all over the world.

Accordingly, in order to purify waste gas generated in a semiconductor manufacturing process, waste gas with dust and acid gas removed is in general introduced from a wet pre-treatment device into a reactor to decompose perfluorinated compounds by thermal decomposition or catalytic reaction, and the remaining particulate matters and acid gas were removed in a wet post-treatment device.

In this case, the waste gas introduced into the reactor is heated to a high thermal decomposition temperature or catalytic reaction temperature, and the waste gas discharged from the reactor is cooled to a low temperature by the wet post-treatment device or a cooling device.

Thus, when a heat exchange unit is not provided separately, energy may be excessively consumed due to low thermal efficiency, and even if the heat exchange unit is provided, a waste heat recovery rate of waste gas heated to a high temperature is not good enough.

Meanwhile, an existing wet pre-treatment technology is simply to process dust and acid gas by spraying moisture into introduced waste gas. In the existing wet pre-treatment technology, there is low chance of gas-liquid contact, resulting in low pollutant removal efficiency.

The matters provided in the above background art are only intended to help better understand the background of the present invention. It should not be construed, however, that the present disclosure falls under the related art already known to a person skilled in the art.

SUMMARY

The present disclosure provides a waste gas treatment apparatus for semiconductor and display processes, by which a waste heat recovery rate of high-temperature waste gas discharged from a reactor is improved, thereby reducing energy consumption.

In addition, the present disclosure also provides a waste gas treatment apparatus for semiconductor and display processes, by which the chance of gas-liquid contact is increased so as to improve efficiency of wet pre-treatment.

Technical objects to be achieved by the present disclosure are not limited to the technical objects mentioned above, and other technical objects not mentioned will be clearly understood by those skilled in the art from the description of the present disclosure.

In an aspect, a waste gas treatment apparatus for semiconductor and display processes includes: a pre-treatment unit having an inlet and an outlet formed therein, and configured to spray a cleaning solution to waste gas introduced through the inlet to primarily treat particulate matters and acid gas in the waste gas; a reaction unit configured to simultaneously treat fluorine compounds and nitrous oxide ($N_2O$) in waste gas discharged from the pre-treatment unit; a post-treatment unit configured to spray a cleaning solution to waste gas discharged from the reaction unit to secondarily treat particulate matters and acid gas in the waste gas; and a heat exchange unit installed between the pre-treatment unit and the reaction unit, and configured to primarily exchange heat of the waste gas discharged from the reaction unit with the waste gas discharged from the pre-treatment unit and secondarily exchange heat of the primarily heat-exchanged waste gas of the reaction unit with waste gas introduced into the pre-treatment unit.

The pre-treatment unit may include: a pre-treatment body having an inlet and an outlet formed therein, and having an internal space in which the waste gas and the cleaning solution are in gas-liquid contact; a partition plate extending downward from a ceiling of the pre-treatment body to divide the internal space of the pre-treatment body into a first treatment region and a second treatment region; one or more spray nozzles installed in a first treatment region adjacent to the inlet to spray the cleaning solution to primarily treat particulate matters and acid gas; and a plurality of guide plates installed horizontally with respect to a bottom surface of the second treatment region, and installed alternately on one side and the other side of an inner wall of the second treatment region at a predetermined interval to recover moisture from the waste gas and secondarily treat particulate matters and acid gas.

The reaction unit may include: a thermal decomposition body; a heater part installed inside the thermal decomposition body to thermally decompose fluorine compounds in the waste gas discharged from the pre-treatment unit; and a catalyst part installed in the thermal decomposition body to be located at a rear end of the heater part in a waste gas flow direction to adsorb or decompose the fluorine compounds and nitrous oxide ($N_2O$) in the waste gas.

The heat exchange unit may include: a first heat exchange unit configured to primarily exchange heat of the waste gas discharged from the pre-treatment unit with the waste gas discharged from the reaction unit to adjust a temperature of the waste gas discharged from the pre-treatment unit; and a second heat exchange unit configured to exchange heat of the primarily heat-exchanged waste gas of the reaction unit with the waste gas introduced into the pre-treatment unit to pre-heat the waste gas.

The post-treatment unit may spray the cleaning solution to the waste gas of the reaction unit, which has passed through the second heat exchanger, to secondarily treat the acid gas and the particulate matters in the waste gas.

In the present disclosure, as high-temperature waste gas discharged from a reactor is cooled after heat exchange with waste gas introduced into or discharged from a wet prepro- cessor through the two-stage heat exchange unit, it is pos- sible to improve a waste heat recovery rate and reduce maintenance costs accordingly.

In addition, as a plurality of guide plates is alternately installed at an inner wall of a discharge portion of a pre-treatment unit to increase the chance of gas-liquid contact, it is possible to improve the efficiency of removal of particulate matters and acid gas from waste gas.

In addition, since a removal rate of dust and acid gas contained in the waste gas is improved in a pre-treatment unit, the lifetime of the catalyst is increased, thereby improv- ing the waste gas purification efficiency.

DESCRIPTION OF EXEMPLARY EMBODIMENTS

Figures 1, 2:
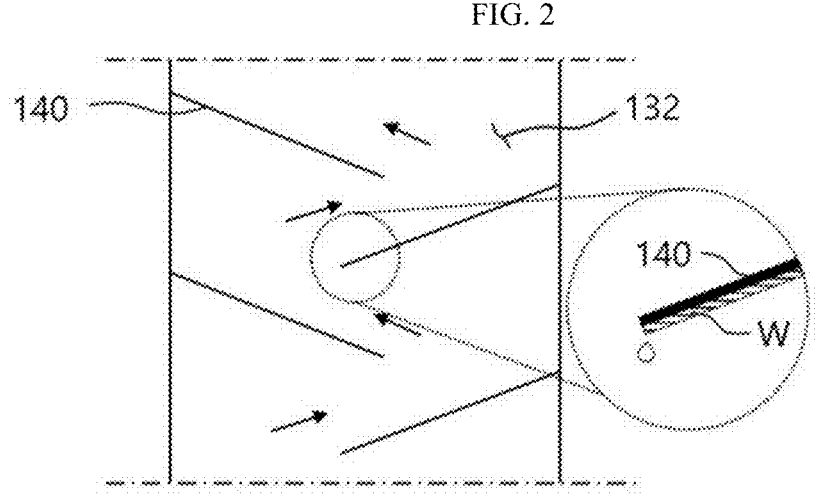
FIG. 1 is a diagram illustrating a waste gas treatment apparatus for semiconductor and display processes accord- ing to an embodiment of the present disclosure.
FIG. 2 is a diagram illustrating a second treatment region according to another embodiment of the present disclosure.

Hereinafter, exemplary embodiments will be described with reference to accompanying drawings. However, the present disclosure is not limited to the exemplary embodi- ments. For reference, like reference numerals substantially denote like elements throughout, and thus, a description made with reference to a drawing can be used for another description made with reference to another drawing.

The present disclosure relates to a waste gas treatment apparatus for semiconductor and display processes for puri- fying waste gas generated in a semiconductor manufacturing process, and it is characterized by effectively removing perfluorinated compounds contained in waste gas and improving a waste heat recovery rate.

FIG. 1 is a diagram illustrating a waste gas treatment apparatus for semiconductor and display processes accord- ing to an embodiment of the present disclosure.

As shown in FIG. 1, the waste gas treatment apparatus for semiconductor and display processes according to an embodiment of the present disclosure may include a pre- treatment unit 100, a reaction unit 200, a post-treatment unit 300, and a heat exchange unit 400.

Waste gas generated in a semiconductor or display manu- facturing treat may be introduced into the pre-treatment unit 100 and subjected to wet pre-treatment in the pre-treatment unit 100. Cleaning solution is sprayed to the introduced waste gas so as to primarily treat particulate matters and acid gas in the waste gas.

More specifically, the pre-treatment unit 100 may include a pre-treatment body 110, a partition plate 130, a spray nozzle 120, and a guide plate 140.

In the pre-treatment body 110, an inlet 111 and an outlet 112 may be formed, and an internal space in which gas-liquid contact between the waste gas and the cleaning solution occurs may be formed.

The partition plate 130 may extend downward from a ceiling of the pre-treatment body 110 to divide an internal space into a first treatment region 131 and a second treat- ment region 132.

The inlet 111 of the pre-treatment body 110 may be formed in the first treatment region 131, and the outlet 112 may be formed in the second treatment region 132.

Thus, the waste gas may flow into the first treatment region 131 through the inlet 111, move to the second treatment region 132, and be then discharged from the pre-treatment body 110 through the outlet 112.

Accordingly, it is preferable that one side of the partition plate 130 extending downward extends to be spaced apart from a lower surface of the pre-treatment body 110 by a predetermined distance. This is to facilitate waste gas to be introduced into the first treatment region 131 and then move to the second treatment region while the internal space of the pre-treatment body 110 is divided.

More preferably, the partition plate 130 may extend downward from a position corresponding to $2/3$ to $3/4$ of the pre-treatment body 110.

When one end of the partition plate 130 extends down- ward to a position less than $2/3$ of the pre-treatment body 110, a space for sufficiently condensing moisture in the waste gas may not be secured in the second treatment region 132.

When one end of the partition plate 130 extends down- ward beyond a position corresponding to $3/4$ of the pre- treatment body 110, it may be difficult for the waste gas to move from the first treatment region 131 to the second treatment region 132.

Thus, a pressure load may occur in the pre-treatment body 110, or waste gas purification efficiency may decrease.

One or more spray nozzles 120 according to an embodi- ment of the present disclosure may be installed at the first treatment region 131 adjacent to the inlet 111 and may spray cleaning solution to primarily treat particulate matters and acid gas.

In this case, the cleaning solution may be sprayed in a moving direction of the waste gas. However, aspects of the present disclosure are not limited thereto, and the cleaning solution may be sprayed in a direction opposite to the moving direction of the waste gas. Accordingly, it is possible to increase the contact efficiency between the cleaning solution and the waste gas.

In addition, as the spray nozzle 120 of the present disclosure, a high-pressure spray nozzle to finely mist the cleaning solution particles through a small nozzle hole, and an air fog spray nozzle to evenly spray the cleaning solution by generating mist using the cleaning solution and air may be used.

However, aspects of the present disclosure are not limited thereto, and the cleaning solution may be supplied in a way of flowing along an inner wall of the first treatment region 131 of the pre-treatment body 110.

In this case, the cleaning solution may be provided as water or sodium hydroxide (NaOH) aqueous solution. In particular, the sodium hydroxide (NaOH) aqueous solution may neutralize the acid gas contained in the waste gas.

The guide plate 140 may be installed horizontally with respect to a bottom surface of the second treatment region 132, and a plurality of guide plates may be alternately installed on one side and the other side of the inner wall of the second treatment region 132 at regular intervals.

The waste gas ascending in the second treatment region 132 may collide with lower surfaces of the plurality of guide plates 140, so that water in which particulate matters and acid gas are collected from the waste gas and dissolved can be recovered and subjected to secondary treatment.

In this case, a distance between each two of the plurality of guide plates 140 may be provided to an extent that a pressure differential between the inside and outside of the pre-treatment unit 100 does not occur since the waste gas moves in the internal space of the pre-treatment body 110.

The cleaning solution sprayed from the spray nozzle 120 and the moisture recovered from the lower surfaces of the guide plates 140 may descend in the form of water droplets and be condensed on the lower surface of the pre-treatment body 110.

In this case, when the condensed water exceeds a predetermined amount, the condensed water may be drained through a drain hole (not shown) so that the condensed water do not contact one side of the partition plate 130.

The drained condensed water may be purified and neutralized to be discarded or reused in the spray nozzle 120.

Meanwhile, the waste gas introduced into the first treatment region 131 may be mixed with the cleaning solution sprayed from the spray nozzle 120 and descend rapidly. However, the waste gas ascending in the second treatment region 132 collides with the plurality of guide plates 140 and a flow rate thereof becomes slower than that in the first treatment region 131, and thus, the pressure of the waste gas may increase rapidly. Therefore, it is preferable that the partition plates 130 are disposed so that the second treatment region 132 is equal to or larger than the first treatment region 131.

The waste gas discharged from the pre-treatment unit 100 may move to the reaction unit 200, and the reaction unit 200 may simultaneously treat fluorine compounds and nitrous oxide ($N_2O$) in the waste gas.

The reaction unit 200 may include a thermal decomposition body 210 in which waste gas is accommodated, a heater part 220 for thermally decomposing fluorine compounds in the waste gas, and a catalyst part 230 for adsorbing or decomposing fluorine compounds and nitrous oxide ($N_2O$) in the waste gas.

The waste gas may be introduced from a top of one side of the thermal decomposition body 210 and then move downward.

The heater part 220 may be installed such that one side thereof extends downward from a ceiling of the thermal decomposition body 210 so as to be parallel to a moving direction of the waste gas descending in the thermal decomposition body 210.

In addition, one end of the heater part 220 may be installed to be spaced apart from a bottom surface of the thermal decomposition body 210 by a predetermined interval.

Therefore, the waste gas may be preferably heated to 500 to 800° C. during movement, thermally decomposing the fluorine compounds. When the waste gas is heated to a temperature less than 500° C., a decomposition rate of the fluorine compounds may be low. When the waste gas is heated to a temperature exceeding 800° ° C., the catalyst part 230 may be rapidly deteriorated.

In addition, it is preferable to use an electric heater as the heater part 220 in order to prevent damage to the catalyst part 230.

After the fluorine compounds in the waste gas are thermally decomposed, the waste gas may pass between one end of the heater part 220 and the bottom surface of the thermal decomposition body 210 and then ascend. The catalyst part

230 may be located at a rear end of the heater part 220 in a flow direction of the waste gas.

As the catalyst used in the catalyst part 230, an adsorptive catalyst for adsorbing and removing fluorine compounds generated as a result of decomposition of perfluorinated compounds, a nitrous oxide ($N_2O$) decomposition catalyst for directly decomposing nitrous oxide, and the like may be used. It is preferable to use a catalyst having excellent corrosion resistance to fluorine as the catalyst used in the catalyst part 230.

More preferably, a catalyst for adsorbing and removing highly corrosive fluorine compounds may be disposed first, and a nitrous oxide decomposition catalyst may be disposed at the rear. In this way, as the catalysts are arranged sequentially, it is possible to maximize the removal efficiency of pollutants and lower the temperature of the discharged gas.

As described above, when the waste gas is decomposed in the reaction unit 200, particulate matters and acid gas are generated, and the waste gas is discharged to the post-treatment unit 300 for removal.

In the post-treatment unit 300, a cleaning solution may be sprayed to the waste gas to secondarily treat the particulate matters and the acid gas, and may be then discharged into the atmosphere.

Meanwhile, the heat exchange unit 400 may be installed between the pre-treatment unit 100 and the reaction unit 200 to recover waste heat from high-temperature waste gas discharged from the reaction unit 200. The heat exchange unit 400 performs primary heat-exchange between the waste gas discharged from the reaction unit 200 and the waste gas discharged from the pre-treatment unit 100. The primarily heat-exchanged waste gas from the reaction unit 200 may be subject to secondary heat-exchange with the waste gas introduced into the pre-treatment unit 100.

The waste gas introduced into the reaction unit 200 through the primary and secondary heat-exchange may be pre-heated, thereby improving the energy efficiency of the heater part 220, and the waste gas discharged from the reaction unit 200 may be effectively cooled, resulting in improvement of thermal efficiency.

As described above, in order to facilitate heat exchange of waste gas discharged from the reaction unit 200, the heat exchange unit 400 may include a first heat exchange unit 410 and a second heat exchange unit 420.

The first heat exchange unit 410 may perform primary heat-exchange between the waste gas discharged from the pre-treatment unit 100 and the waste gas discharged from the reaction unit 200. The temperature of the waste gas discharged from the pre-treatment unit 100 may be adjusted by the first heat exchanger 410. Thus, the pre-heated waste gas may be introduced into the reaction unit 200, resulting in the effect of lowering the energy consumption of the heater part 220.

In the second heat exchange unit 420, the waste gas of the reaction unit 200, which has been primarily heat exchanged in the first heat exchange unit 410, may be heat exchanged with the waste gas introduced into the pre-treatment unit 100, so that the waste gas is pre-heated. The pre-heated waste gas may be introduced into the pre-treatment unit 100, thereby further maximize the waste gas temperature control effect of the first heat exchanger 410. In this case, the waste gas of the reaction unit 200 may be cooled and move to the post-treatment unit 300.

Meanwhile, in the post-treatment unit 300, the cleaning solution may be sprayed too the waste gas of the reaction unit 200, which has been cooled after passing through the second heat exchanger 420. Acid gas and particulate matters in the waste gas may be secondarily treated and discharged into the atmosphere.

FIG. 2 is a diagram illustrating a second treatment region according to another embodiment of the present disclosure.

As shown in FIG. 2, the second treatment region 132 according to another embodiment of the present disclosure may include a guide plate 140 inclined at a certain angle, and a water film (W) formed in a bottom surface of the guide plate 140.

As the guide plate 140 is installed in a form extending downward at a predetermined angle with respect to the ground, the guide plate 140 may be provided longer than in a case where the guide plate 140 is installed horizontally.

Thus, a gas-liquid contact area between waste gas and the water film (W) formed in the lower surface of the guide plate 140 may increase, thereby improving a moisture recovery rate.

The water film (W) formed in the bottom surface of the guide plate 140 may descend in the form of water droplets on a cross-sectional area of one side inclined downward. A space between one side of the guide plate 140 and another guide plate 140 located below the guide plate 140 may be gradually narrowed in a waste gas flow direction indicated by an arrow in the drawing.

As a result, the waste gas passing through a plurality of guide plates 140 and the descending water droplets may be more likely contact with each other.

Therefore, it is possible to improve the purification efficiency of particulate matters and acid gas in the waste gas.

As described above, although it has been described with reference to the preferred embodiments of the present disclosure, those skilled in the art will variously modify and change the present disclosure within the scope not departing from the spirit and scope of the present disclosure described in the claims below.

What is claimed is:

1. A waste gas treatment apparatus for semiconductor and display processes, the apparatus comprising:
   a pre-treatment unit having an inlet and an outlet formed therein, and configured to spray a cleaning solution to waste gas introduced through the inlet to primarily treat particulate matters and acid gas in the waste gas;
   a reaction unit configured to simultaneously treat fluorine compounds and nitrous oxide (N2O) in waste gas discharged from the pre-treatment unit;
   a post-treatment unit configured to spray a cleaning solution to waste gas discharged from the reaction unit to secondarily treat particulate matters and acid gas in the waste gas; and

8 a heat exchange unit installed between the pre-treatment unit and the reaction unit, and comprising:
   a first heat exchange unit configured to primarily exchange heat of the waste gas discharged from the pre-treatment unit with the waste gas discharged from the reaction unit to adjust a temperature of the waste gas discharged from the pre-treatment unit; and
   a second heat exchange unit configured to exchange heat of the primarily heat-exchanged waste gas of the reaction unit with the waste gas introduced into the pre-treatment unit to pre-heat the waste gas.

2. The apparatus of claim 1, wherein the pre-treatment unit comprises:
   a pre-treatment body having an inlet and an outlet formed therein, and having an internal space in which the waste gas and the cleaning solution are in gas-liquid contact;
   a partition plate extending downward from a ceiling of the pre-treatment body to divide the internal space of the pre-treatment body into a first treatment region and a second treatment region;
   one or more spray nozzles installed in the first treatment region adjacent to the inlet to spray the cleaning solution to primarily treat particulate matters and acid gas; and
   a plurality of guide plates installed horizontally with respect to a bottom surface of the second treatment region, and installed alternately on one side and the other side of an inner wall of the second treatment region at a predetermined interval to recover moisture from the waste gas and secondarily treat particulate matters and acid gas.

3. The apparatus of claim 1, wherein the reaction unit comprises:
   a thermal decomposition body;
   a heater part installed inside the thermal decomposition body to thermally decompose fluorine compounds in the waste gas discharged from the pre-treatment unit; and
   a catalyst part installed in the thermal decomposition body to be located at a rear end of the heater part in a waste gas flow direction to adsorb or decompose the fluorine compounds and nitrous oxide (N2O) in the waste gas.

4. The apparatus of claim 1, wherein the post-treatment unit sprays the cleaning solution to the waste gas of the reaction unit, which has passed through the second heat exchanger, to secondarily treat the acid gas and the particulate matters in the waste gas.

* * * * *